US010761769B2

(12) United States Patent
Cadloni et al.

(10) Patent No.: US 10,761,769 B2
(45) Date of Patent: Sep. 1, 2020

(54) ACCESSIBLE ACCUMULATED MEMORY TEMPERATURE READINGS IN A MEMORY SUB-SYSTEM

(71) Applicant: Micron Technology, Inc., Boise, ID (US)

(72) Inventors: Gerald L. Cadloni, Longmont, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 16/121,558

(22) Filed: Sep. 4, 2018

(65) Prior Publication Data

US 2020/0073577 A1 Mar. 5, 2020

(51) Int. Cl.
*G06F 12/00* (2006.01)
*G06F 3/06* (2006.01)

(52) U.S. Cl.
CPC .......... *G06F 3/0653* (2013.01); *G06F 3/0614* (2013.01); *G06F 3/0679* (2013.01)

(58) Field of Classification Search
CPC .. G06F 13/06; G06F 13/0614; G06F 13/0653; G06F 13/0679; G06F 12/00; G06F 13/00; G06F 3/06; G06F 3/0614; G06F 3/0653; G06F 3/0679
USPC ......................................... 711/100, 154, 200
See application file for complete search history.

(56) References Cited

U.S. PATENT DOCUMENTS

| 4,728,199 | A  | * | 3/1988  | Murai ..................... G01K 1/026 374/163 |
| 7,590,020 | B2 |   | 9/2009  | Lee |
| 8,140,293 | B2 |   | 3/2012  | Jeong et al. |
| 9,846,554 | B1 | * | 12/2017 | Lai .......................... G11C 29/80 |
| 2007/0019488 | A1 | * | 1/2007  | Heilmann ................ G11C 7/04 365/211 |
| 2017/0255403 | A1 | * | 9/2017  | Sharon .................. G06F 3/0619 |

FOREIGN PATENT DOCUMENTS

| KR | 100611505 B1 | 8/2006 |
| KR | 100807594 B1 | 2/2008 |

OTHER PUBLICATIONS

International Application No. PCT/US2019/046020—International Search Report and Written Opinion, dated Dec. 2, 2019, 12 pages.

* cited by examiner

*Primary Examiner* — Tuan V Thai
(74) *Attorney, Agent, or Firm* — Perkins Coie LLP

(57) ABSTRACT

A memory sub-system is disclosed that makes accessible accumulated memory temperature statistics in relation to a target memory portion. This can be accomplished by maintaining one or more hold variables and one or more accumulation variables. The accumulation variables can be iteratively updated upon triggers such as a timer expiration or I/O event. Updating the accumulation variables can include obtaining a current temperature and tracking one or more of: a maximum, minimum, and mean temperature across the iterations. An accumulation value can track how many times the accumulation variables have been updated. When the accumulation value reaches an accumulation action threshold, the current state of the accumulation variables can be used to update the hold variables. The accumulation value and accumulation variables can then be reset and used for accumulation of additional temperature statistics.

20 Claims, 4 Drawing Sheets

ACCESSIBLE ACCUMULATED MEMORY TEMPERATURE READINGS IN A MEMORY SUB-SYSTEM

TECHNICAL FIELD

The present disclosure generally relates to a memory sub-system, and more specifically, relates to making accessible accumulated memory temperature readings in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to accumulating temperature statistics, for a memory sub-system, that are accessible on a real-time basis. As used herein, the term real-time is used to indicate events that occur proximate in time to their cause, e.g., without unnecessary delay. For example, a set of accumulated temperature statistics are available in "real time" because they can be retrieved by a user or for analysis by another process immediately following the temperature being taken and stored.

In various implementations, the memory statistics can include one or more of: individual temperature measurements, a maximum temperature, a minimum temperature, a mean temperature or a deviation in temperature measurements. A memory sub-system is also hereinafter referred to as a "memory device". An example of a memory sub-system is a storage system, such as a solid-state drive (SSD). In some embodiments, the memory sub-system is a hybrid memory/storage sub-system. In various implementations, a memory sub-system can include non-volatile memory devices, such as, for example, negative-and (NAND). In general, a host system can utilize a memory sub-system that includes one or more memory components. The host system can provide data to be stored at the memory sub-system and can request data to be retrieved from the memory sub-system.

In conventional memory systems, temperature measurements are not taken consistently. For example, in some NAND devices, temperature measurements may be taken in response to NAND events such as a read or write, but periods without such an event can result in a lack of temperature data points. Temperature statistics in such cases do not reflect a complete picture of the memory system and such statistics may not be up-to-date. In addition, in conventional systems, operations related to temperature measurements are the responsibility of a memory system controller. This increases the load on the system controller while limiting the ability of a memory component to implement an individual thermal compensation algorithm.

Aspects of the present disclosure address the above and other deficiencies by continuously accumulating temperature statistics for a NAND die or other target memory portion. Memory statistic accumulation can begin when the target memory portion is powered on or reset. Continuously accumulated temperature statistics can be updated using new temperature measurements taken in response to either a timer or an event for the target memory portion. This approach enables maintaining complete and up-to-date temperature measurement statistics. In some implementations, the target memory portion controller can be responsible for identifying opportunities to take temperature measurements and for incorporating the temperature measurements into accumulated statistics. This reduces the load on the memory system controller by offloading responsibility for this function onto the target memory portion (e.g. NAND die).

Figure 1:
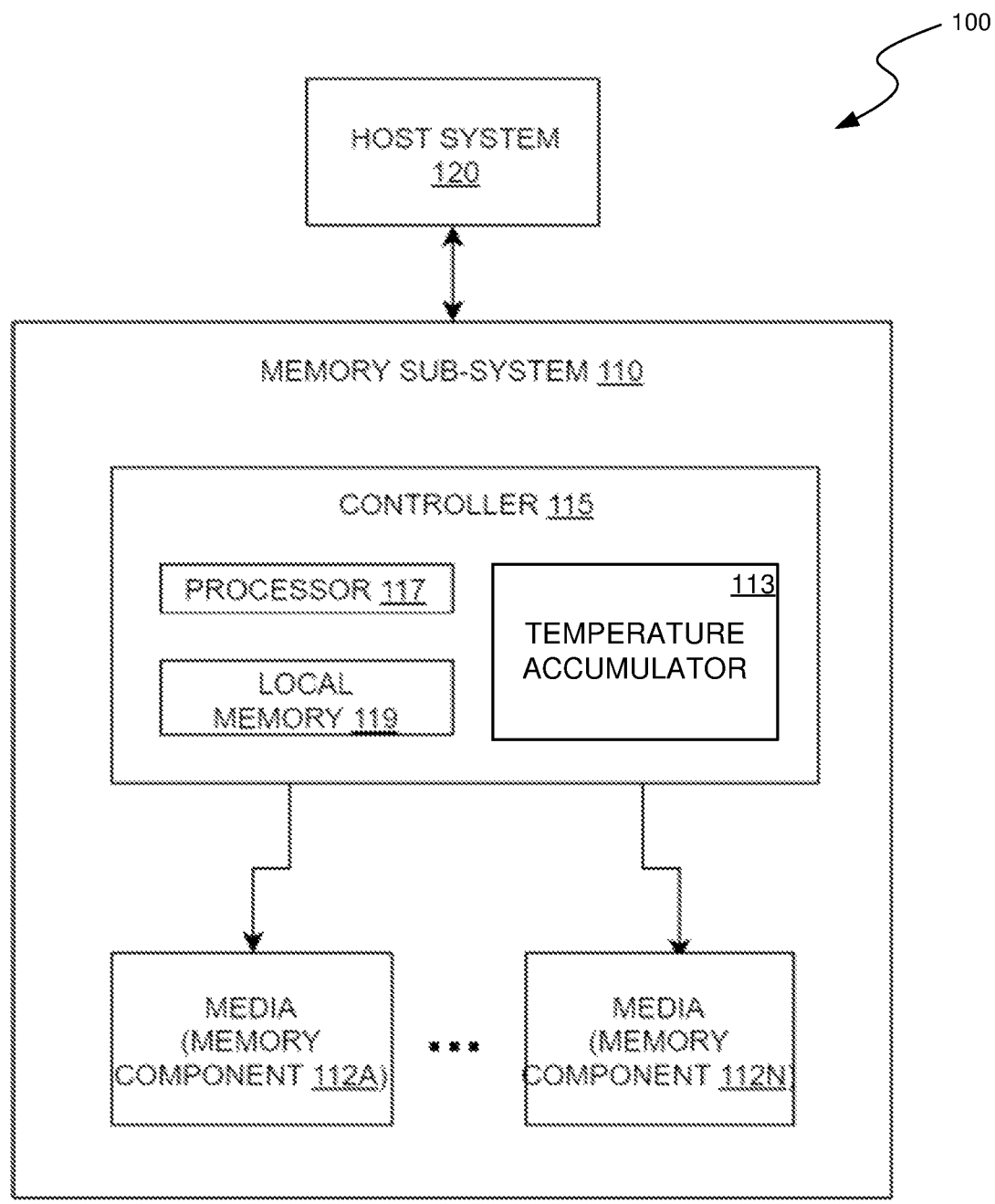
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a temperature accumulator 113 that can be used to trigger temperature measurements and accumulate them into temperature statistics. In some embodiments, the controller 115 includes at least a portion of the temperature accumulator 113. In some embodiments, memory components 112A to 112N can including processing that includes at least a portion of the temperature accumulator 113. For example, the controller 115 can include a processor 117 (processing device) configured to execute instructions stored in local memory 119 for performing the operations described herein. In some embodiments, the temperature accumulator 113 is part of the host system 110, an application, or an operating system.

The temperature accumulator 113 can maintain a set of hold variables for accumulated memory statistics in relation to memory components 112A to 112N of the memory sub-system 110. Upon power on or reset of the memory component, the temperature accumulator 113 can record, in the hold variables for an individual memory component, initial temperature measurements. The temperature accumulator 113 can further maintain a timer and an event value (e.g. a counter) for each memory component. When the timer or the event value reaches a threshold, temperature accumulator 113 can obtain a temperature measurement and use it to update the accumulated temperature measurements in the hold variables. For example, the temperature accumulator 113 can track a maximum temperature, a minimum temperature, a temperature deviation, a mean temperature, or any combination thereof. Further details with regards to the operations of the temperature accumulator 113 are described below.

Figure 2B:
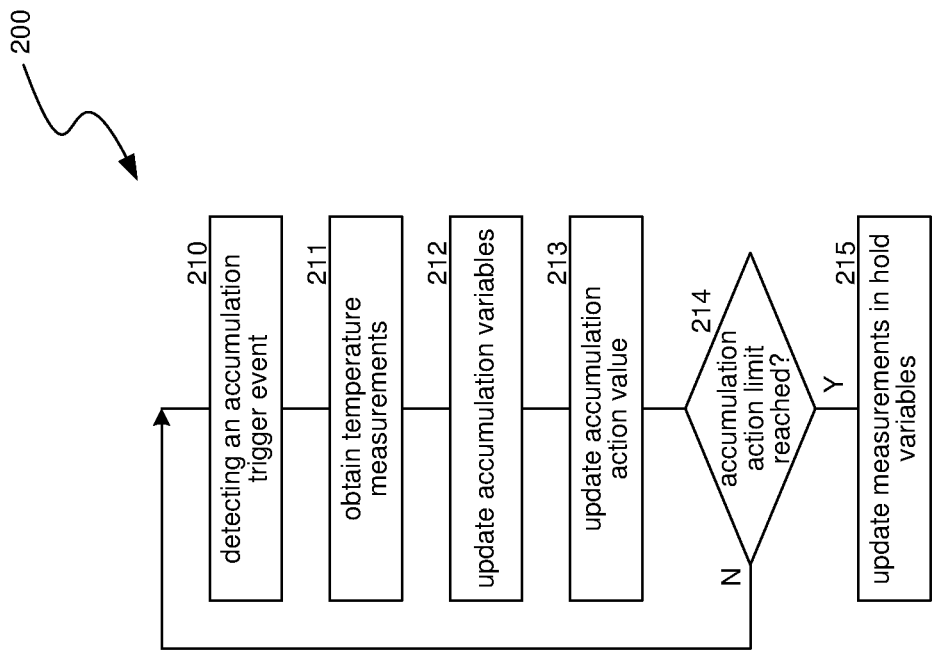
FIGS. 2A and 2B are flow diagrams of accumulating temperature statistics in relation to a target memory portion in accordance with some embodiments of the present disclosure.
Figure 2A:
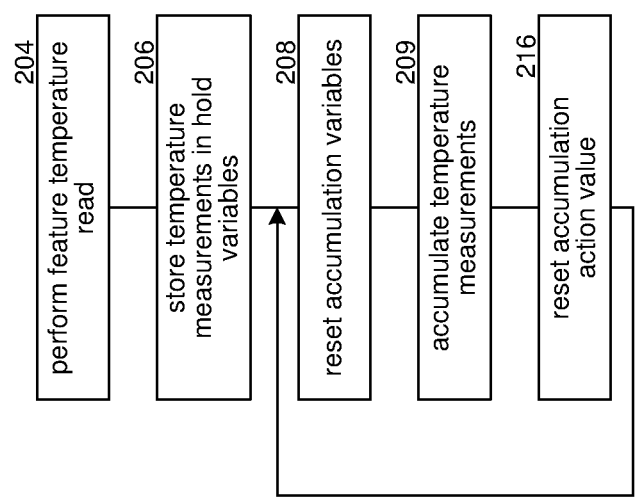

FIGS. 2A and 2B are of a flow diagram of an example method 200 for accumulating temperature statistics in relation to a target memory portion in accordance with some implementations of the present technology. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the temperature accumulator 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the processing logic can be performed in relation to a target memory portion, such as one or more memory systems (e.g. NAND devices), one or more die (e.g. a NAND die) in a memory system, one or more blocks of die, one or more pages, etc. In some implementations where the processing logic is performed on a die target memory portion (e.g. a NAND die), the processing logic can be performed by a controller of the die, reducing the load that may otherwise fall on a system controller for recording temperatures and computing temperature statistics for various memory portions. In some implementations, the processing logic can be initiated when the memory portion is powered on or is reset. At block 204, the processing logic can perform a feature temperature read on the target memory portion. A feature temperate read is any action that results in a temperature reading. In some implementations, a target memory portion records a temperature upon certain events, such as in the course of performing an I/O event. In some implementations, the processing logic can use a "get" I/O event to cause a temperature reading for the target memory portion.

At block 206, the processing logic can store temperature measurements in one or more hold variables that the processing logic has access to. In various implementations, the hold variables can correspond to registers in a memory system, other designated memory space, or to variables in a program which can be stored in various system memory resources. As used herein, the processing logic can obtain access to variables in various ways, such as by loading to and from registers, reading and setting named variables in a memory stack, reading and writing to particular memory addresses, etc. In some implementations, the hold variables can store one or more temperature statistics such as: a maximum temperature, a minimum temperature, a median temperature, a mean temperature, or a variance in recorded temperatures. In some implementations, the hold variables can store histogram data for temperature readings observed by the processing logic thus far.

At block 208, the processing logic can access or reset accumulation variables. Similarly to the hold variables, in various implementations the accumulation variables can correspond to registers in a memory system, other designated memory space, or to variables in a program which can be stored in various system memory resources. Accumulation variable can store temperature statistics to be used by block 210 until an amount of accumulation actions reaches an accumulation action limit threshold. In some implementations, the accumulation variables and the hold variables are floating point variables. At block 208, the accumulation variables are reset (e.g. cleared, set to 0, etc.) so they can begin to accumulate new temperature statistics from further accumulation action updating. If this is the first time the processing logic has reached block 208, the processing logic can also obtain access to an accumulation action value and initialize it (e.g. set it to zero to be incremented and compared with an accumulation action limit threshold or set to the value of the accumulation action limit threshold to be decremented and compared to zero).

At block 209, the processing logic can accumulate temperature measurements. Accumulating temperature measurements can include performing iterations until an accumulation action value reaches a limit. Each iteration can include waiting until an accumulation trigger occurs and, in response, obtaining temperature measurements and using them to update accumulation variables. Once the accumulation action value reaches the limit, the accumulation variables can be used to update the hold variables. Additional details on accumulating temperature measurements are provided below in relation to FIG. 2B and FIG. 3.

At block 216, the processing logic can reset the accumulation action value. For example, the processing logic can set an accumulation action counter to zero to be incremented at block 213 and compared with an accumulation action limit threshold or set the accumulation action counter to the value of the accumulation action limit threshold to be decremented at block 213.

FIG. 2B provides additional details regarding the operations performed in some implementations by the processing logic at block 209. At block 210, the processing logic can detect an accumulation trigger event. In various implementations, an accumulation action trigger event can be when a timer reaches a threshold, when an event count threshold is reached, or when either a timer or an event count threshold is reached.

At block 211, the processing logic can obtain temperature measurements. In various implementations, temperature measurements can be obtained by reading a stored temperature measurement that was automatically taken as part of the accumulation action trigger event or by causing an I/O event to be performed on the target memory portion, e.g. a read or get operation, which can include taking a temperature measurement.

At block 212, the processing logic can update a set of accumulation variables using the obtained temperature measurements. The accumulation variables can be updated to track one or more of: a maximum temperature, a minimum temperature, a mean temperature, a deviation in temperatures, or any combination thereof. Additional details on detecting accumulation trigger events (block 210), obtaining temperature measurements (block 211), and updating accumulation variables (block 212) are discussed in more detail below in relation to FIG. 3.

At block 213, the processing logic can update an accumulation action value (e.g. by incrementing it to compare with the accumulation action limit threshold, decrementing it to compare with zero, etc.). At block 214, the processing logic can determine whether the accumulation action limit threshold has been reached based on the accumulation action value. In some implementations, the accumulation action limit can be a programmable value set by a user.

At block 215, the processing logic can update the statistics in the hold variables with the statistics accumulated in the accumulation variables. In some implementations, the hold variables can store a record of all the accumulation variable values for each time the processing logic reaches block 215, e.g. in a log. In some implementations, the hold variables can combine some or all of the accumulation variable values, e.g. to track overall statistics such as the maximum and minimum temperature for the target memory portion. After block 215, temperature measurements have been accumulated (e.g. block 209 has been completed) and the processing logic can continue to block 216 of FIG. 2A.

Through various iterations of blocks 206-216, the processing logic can generate statistics for the target memory portion. These statistics can be used in various procedures, such as to adjust operating parameters of the target memory portion of the memory system to improve reliability or performance, as input to the design process for, to ensure compliance with operating guidelines, to control an individual thermal compensation algorithm, etc.

Figure 3:
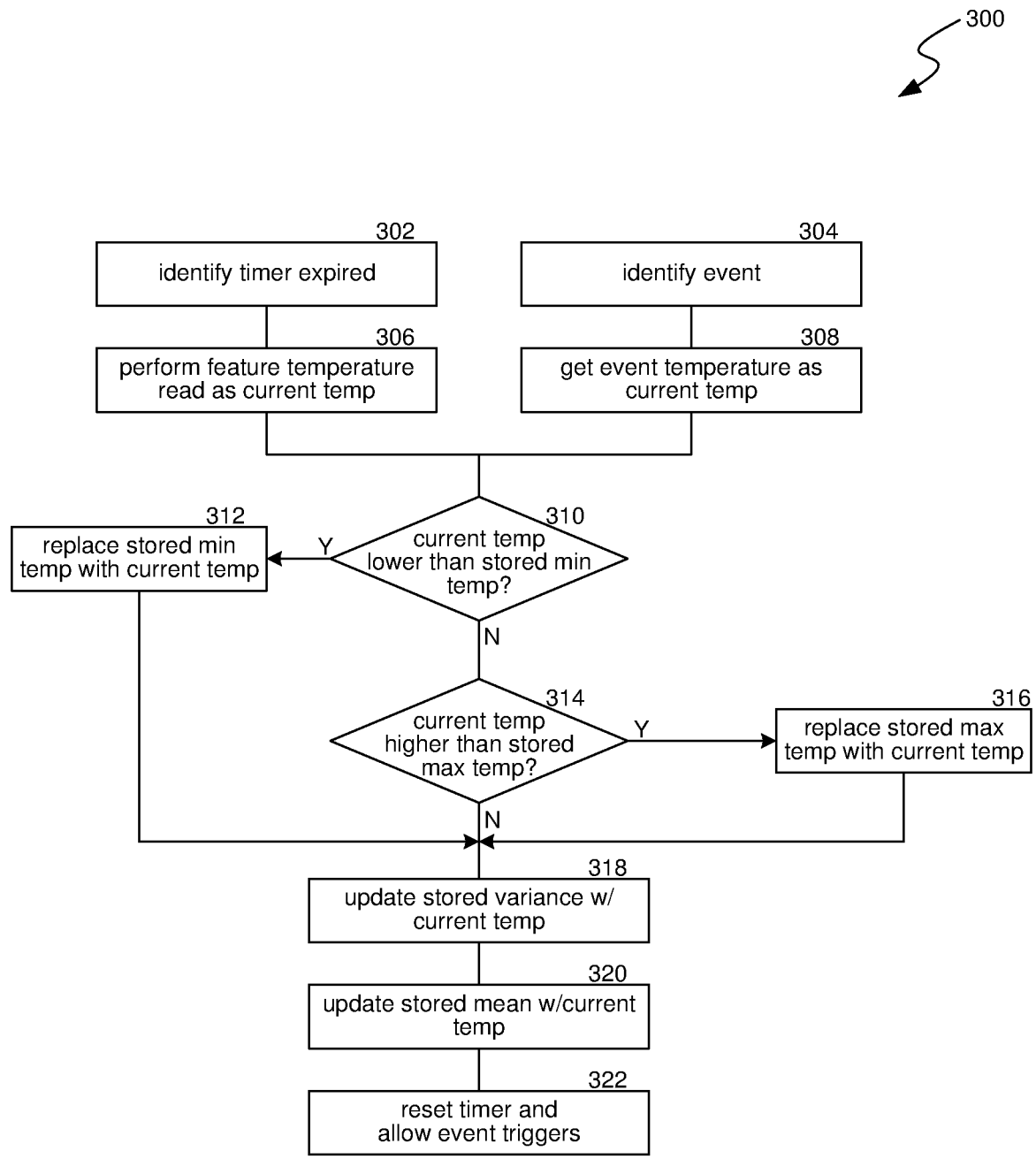
FIG. 3 is a flow diagram of acquiring a subsequent temperature measurement for updating accumulated temperature statistics in accordance with some embodiments of the present disclosure.

FIG. 3 is a flow diagram of an example method 300 for acquiring a subsequent temperature measurement for updating accumulating temperature statistics in accordance with some implementations of the present technology. The method 300 is a more detailed view of some implementations of the operations performed in blocks 210-212 of FIG. 2B. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the temperature accumulator 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The processing logic for method 300 can be initiated at block 302 when the processing logic identifies that a timer has reached a threshold or at block 304 when the processing logic identifies that an event has occurred. An "event" can be various triggers such as a read, write, get, or another I/O operation performed on a target memory portion. In some implementations, events can be other actions that cause a temperature reach on a target memory portion. In some implementations, the processing logic is triggered only in response to the timer or only in response to events. In some implementations, when the processing logic is triggered, the timer is paused and new events do not trigger the processing logic until the timer is reset and events are allowed at block 322. In some implementations, an instance of the processing logic can be triggered by either the timer expiration or an event occurring, regardless of when either happened last. In some implementations, the processing logic for method 300 can be part of the processing logic for method 200, and can use the accumulation variables accessed by the processing logic for method 200 at block 208.

At block 306, the processing logic can perform a feature temperature read, e.g. by causing a get operation on the target memory portion. The get operation can cause a temperature measurement to be taken, and the processing logic can access this temperature measurement and use it as a current temperature.

At block 308, the processing logic has identified an event at block 304. This event may have caused an automatic process that records one or more temperature measurements, which the processing logic can access and use as a current temperature. If the event has not caused a temperature measurement, the processing logic can proceed to block 306.

At block 310, the processing logic can determine whether the current temperature is lower than a stored minimum temperature. For example, the processing logic can compare the current temperature to a minimum temperature stored in one of the accumulation variables. If the current temperature is lower than the stored minimum temperature, process 300 continues to block 312. Otherwise, process 300 continues to block 314.

At block 312, the processing logic can replace the stored minimum temperature with the current temperature. For example, the processing logic can replace the minimum temperature stored in one of the accumulation variables with the current temperature.

At block 314, the processing logic can determine whether the current temperature is greater than a stored maximum temperature. For example, the processing logic can compare the current temperature to a maximum temperature stored in one of the accumulation variables. If the current temperature is greater than the stored maximum temperature, process 300 continues to block 316. Otherwise, process 300 continues to block 318.

At block 316, the processing logic can replace the stored maximum temperature with the current temperature. For example, the processing logic can replace the maximum temperature stored in one of the accumulation variables with the current temperature.

At block 318, the processing logic can update a stored variance of measured temperatures using the current temperature. For example, the processing logic can replace a stored standard deviation accumulation variable with a new standard deviation that accounts for the current temperature.

At block 320, the processing logic can update a stored mean temperature using the current temperature. For example, the processing logic can replace a stored mean accumulation variable with a new mean that accounts for the current temperature. More specifically, a new mean can be computed using the formula: $m=(c+n*s)/(n+1)$, where m is the new mean temperature, n is the number of temperature measurements used to generate the stored mean, and c is the current temperature.

In some implementations, the processing logic can also store additional data. For example, each temperature reading can be associated with a timestamp or other meta-data. In some implementations, all the temperature readings can be stored. In some implementations, all the temperature readings within a most recent time window can be stored. In some implementations, the granularity with which temperature readings are stored can increase as temperatures are more recent. For example, all the temperature readings in the last ten minutes can be stored, but only one temperature reading per each prior 10 seconds is stored or an average of temperature readings is stored for each prior 10 second period. In some implementations, any of the temperature statistics can be stored as a histogram of readings.

At block 322, in implementations where the processing logic has paused the timer used for block 302 and is not identifying events for block 304, the processing logic can reset and resume the timer and resume identifying events, allowing new instances of the processing logic for method 300 to be triggered.

Figure 4:
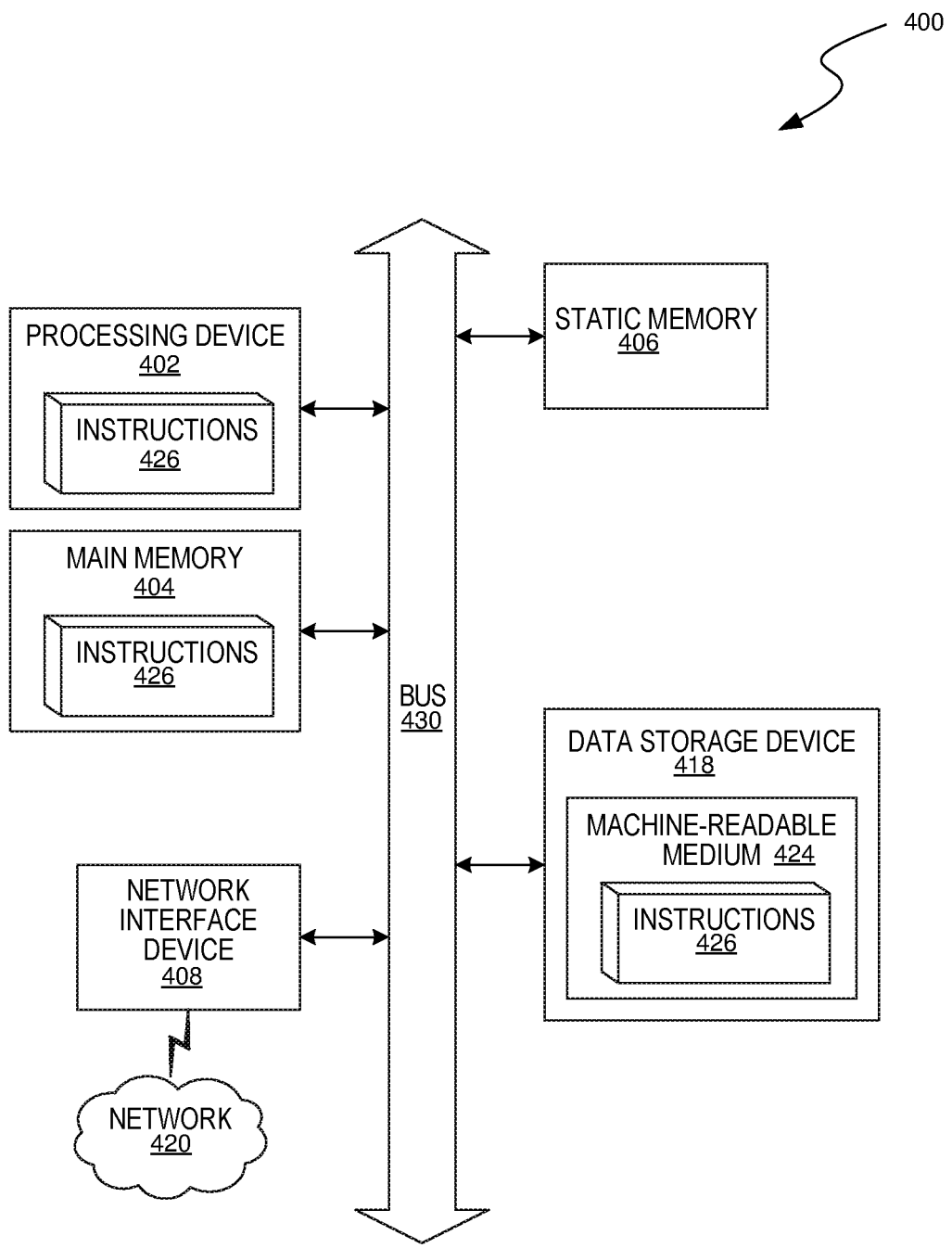
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature accumulator 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to continuously accumulate temperature statistics for a memory portion in response to a timer or event (e.g., the temperature accumulator 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-4 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. A method comprising:
   iterating on a set of operations to update one or more accumulation variables, corresponding to a target memory portion, until a value reaches an accumulation action limit threshold; and
   in response to the value reaching the accumulation action limit threshold, updating one or more hold variables based on the updated one or more accumulation variables,
   wherein the set of operations comprises:
      obtaining, in response to detecting a temperature accumulation trigger event, one or more temperature measurements corresponding to the target memory portion;
      updating the one or more accumulation variables based on the one or more temperature measurements; and
      updating the value for comparison to the accumulation action limit threshold; and
   wherein the one or more hold variables comprise one or more of:
      a minimum temperature record that tracks a minimum temperature for the target memory portion; or
      a mean temperature record that tracks a mean of temperatures for the target memory portion.

2. The method of claim 1,
   wherein the one or more hold variables are initially set based on one or more initial temperature measurements in relation to the target memory portion; and
   wherein the one or more initial temperature measurements are taken in response to a power on event or a reset event for the target memory portion.

3. The method of claim 1,
   wherein the target memory portion comprises a NAND die; and
   wherein the method further comprises:
      performing a feature temperature read on the NAND die;
      storing initial temperature readings resulting from the feature temperature read in the one or more hold variables; and
      repeatedly updating the one or more hold variables during operation of the NAND die, wherein each update to the one or more hold variable is performed by iterating on the set of operations.

4. The method of claim 1, wherein either or both of (A) the one or more hold variables or (B) the one or more accumulation variables are stored in one or more registers, associated with the target memory portion, that are allocated for accumulating temperature statistics.

5. The method of claim 1, wherein the accumulation action limit threshold is a user-customizable limit.

6. The method of claim 1, wherein the temperature accumulation trigger comprises an indication that an I/O operation occurred on the target memory portion or an indication that a timer has reached a predetermined value.

7. The method of claim 1,
wherein the target memory portion is a NAND die;
wherein the temperature accumulation trigger is an indication that an I/O operation occurred on the NAND die; and
wherein the one or more subsequent temperature measurements are obtained from an automatic process that records one or more temperature measurements in relation to the NAND die as part of the event that occurred on the NAND die.

8. The method of claim 1,
wherein the target memory portion is a NAND die;
wherein the temperature accumulation trigger is an indication that a timer has reached a predetermined value; and
wherein obtaining the one or more subsequent temperature measurements in relation to the NAND die comprises:
causing, in response to the timer expiration, an I/O operation on the NAND die; and
obtaining the one or more subsequent temperature measurements following the I/O operation.

9. The method of claim 1, wherein the one or more hold variables comprise:
a minimum temperature record that tracks a minimum temperature for the target memory portion;
a maximum temperature record that tracks a maximum temperature for the target memory portion; and
a mean temperature record that tracks a mean of temperatures for the target memory portion.

10. A computer-readable storage medium storing instructions that, when executed by a computing system, cause the computing system to perform operations comprising:
iterating on a set of operations to update one or more accumulation variables, corresponding to a target memory portion, until a value reaches an accumulation action limit threshold; and
in response to the value reaching the accumulation action limit threshold, updating one or more hold variables based on the updated one or more accumulation variables, wherein the value is based on an amount of updates to the one or more accumulation variables,
wherein the set of operations comprises:
obtaining, in response to detecting a temperature accumulation trigger event, one or more temperature measurements corresponding to the target memory portion;
updating the one or more accumulation variables based on the one or more temperature measurements; and
updating the value for comparison to the accumulation action limit threshold.

11. The computer-readable storage medium of claim 10, wherein the target memory portion comprises a NAND die;
wherein the one or more hold variables are initially set based on one or more initial temperature measurements in relation to the target memory portion; and
wherein the obtaining the one or more initial temperature measurements comprises performing an I/O action on the NAND die that automatically cause the one or more temperature measurements.

12. The computer-readable storage medium of claim 10, wherein either or both of (A) the one or more hold variables or (B) the one or more accumulation variables are stored in one or more registers, associated with the target memory portion, that are allocated for accumulating temperature statistics.

13. The computer-readable storage medium of claim 10, wherein the temperature accumulation trigger comprises an indication that an I/O operation occurred on the target memory portion or an indication that a timer reached a time threshold.

14. The computer-readable storage medium of claim 10,
wherein the target memory portion is a NAND die;
wherein the temperature accumulation trigger is an indication that an I/O operation occurred on the NAND die; and
wherein the one or more subsequent temperature measurements are obtained from an automatic process that records one or more temperature measurements in relation to the NAND die as part of the event that occurred on the NAND die.

15. The computer-readable storage medium of claim 10, wherein the one or more hold variables comprise:
a minimum temperature record that tracks a minimum temperature for the target memory portion;
a maximum temperature record that tracks a maximum temperature for the target memory portion; and
a mean temperature record that tracks a mean of temperatures for the target memory portion.

16. A memory system comprising:
a memory component comprising a target memory portion: and
a processing device operably coupled to the memory component, the processing device configured to:
iterate on a set of operations to update one or more accumulation variables, corresponding to the target memory portion, until a value reaches an accumulation action limit threshold; and
in response to the value reaching the accumulation action limit threshold, update one or more hold variables based on the updated one or more accumulation variables, wherein the one or more hold variables store a log of multiple instances of the one or more accumulation variables at times when the value reached the accumulation action limit threshold,
wherein the set of operations comprises:
obtaining, in response to detecting a temperature accumulation trigger event, one or more temperature measurements corresponding to the target memory portion;
updating the one or more accumulation variables based on the one or more temperature measurements; and
updating the value for comparison to the accumulation action limit threshold.

17. The computing system of claim 16, wherein the target memory portion is a NAND die.

18. The computing system of claim 16, wherein the temperature accumulation trigger comprises an indication that an I/O operation occurred on the target memory portion or an indication that a timer has reached a predetermined value.

19. The computing system of claim 18,
wherein the target memory portion is a NAND die;

wherein the temperature accumulation trigger is an indication that an I/O operation occurred on the NAND die; and wherein the one or more subsequent temperature measurements are obtained from an automatic process that records one or more temperature measurements in relation to the NAND die as part of the event that occurred on the NAND die.

20. The computing system of claim 16, wherein the one or more hold variables comprise:
   a minimum temperature record that tracks a minimum temperature for the target memory portion;
   a maximum temperature record that tracks a maximum temperature for the target memory portion; and
   a mean temperature record that tracks a mean of temperatures for the target memory portion.

\* \* \* \* \*